United States Patent [19]
Mostafazadeh

[11] Patent Number: 5,335,842
[45] Date of Patent: Aug. 9, 1994

[54] SELF-ALIGNING SINGLE POINT BONDING TOOL

[75] Inventor: Shahram Mostafazadeh, San Jose, Calif.

[73] Assignee: National Semiconductor Corporation, Santa Clara, Calif.

[21] Appl. No.: 33,933

[22] Filed: Mar. 19, 1993

[51] Int. Cl.$^5$ .................. H01L 21/603; B23K 3/00
[52] U.S. Cl. .................. 228/179.1; 228/180.21; 228/212; 228/6.2; 228/44.7; 156/580.2
[58] Field of Search ............ 228/110, 179, 180.2, 228/212, 1.1, 4.5, 6.2, 44.7; 156/73.2, 580.2; 219/85.18, 85.19; 437/209

[56] References Cited

U.S. PATENT DOCUMENTS

| | | | |
|---|---|---|---|
| 3,128,649 | 4/1964 | Avila et al. | 228/4.5 |
| 5,132,772 | 7/1992 | Fetty | 357/68 |
| 5,193,732 | 3/1993 | Interrante et al. | 228/4.5 |
| 5,217,154 | 6/1993 | Elwood et al. | 228/4.5 |

FOREIGN PATENT DOCUMENTS

| | | | |
|---|---|---|---|
| 180035 | 10/1983 | Japan | 228/4.5 |
| 76793 | 3/1989 | Japan | 228/4.5 |
| 03041744 | 2/1991 | Japan | 228/110.1 |

OTHER PUBLICATIONS

*Small Precision Tools*, Petaluma, Calif., 94952, pp. 2–5, Copyright 1988.

*Primary Examiner*—Samuel M. Heinrich
*Attorney, Agent, or Firm*—Hickman & Beyer

[57] ABSTRACT

A single point bonding tool which self aligns misaligned leads. The top of the tool is indented in a manner which, when in contact with a misaligned lead, guides the lead into alignment.

11 Claims, 2 Drawing Sheets

SELF-ALIGNING SINGLE POINT BONDING TOOL

FIELD OF THE INVENTION

The present invention relates to a single point bonding tool used for attaching a die to other circuitry. More specifically, it relates to a single point bonding tool which laterally aligns a lead to a connector.

BACKGROUND OF THE INVENTION

In die packaging, a die's pads are attached to connectors or other leads which in turn, are connected to other circuitry. FIG. 1 shows a die lead 11 which has a die pad 12 (or bump) on its top surface. Die pads are at the outer perimeter or edges of a die and act as the die's output terminals.

In packaging the die, the die's pads are typically attached to connectors which are commonly referred to as tape leads 13 which are a group of leads formed into an array of side-by-side leads. During bonding, the die pad 12 is used as the welding material.

After a die pad 11 is connected to a tape lead 13, the lead tape is, in turn, connected to other circuitry such as a bond finger on a package (not shown). The connection of the die pads to the tape leads is often referred to as "inner-lead bonding," and the connection of the tape leads to, for example, a package or leadframe is referred to as the "outer-lead bonding."

To perform inner-lead bonding or outer-lead bonding, either of two techniques can be used. First, gang bonding, which uses thermal compression, can be used to make all connections simultaneously. Alternatively, a more precise bonding method includes the use of a single point bonding tool to make each connection individually. A single point bonding tool uses force, heat and ultrasonic vibration to weld the leads together. As shown in FIG. 1, to make the connection, the leads are positioned so that one is on top of the other. The single point bonding tool then makes contact with the lead on top, applying force, heat and ultrasonic vibration thereto. The die pad welds the leads together to make the connection.

Even with the improved accuracy of the single point bonding method, when using the single point bonding tool of the prior art, there is a tendency for the connected leads to be misaligned. Referring to FIG. 2, a single point bonding tools of the prior art has at its tip 14, a depressed cross hatching similar to a female phillips screw driver. The depressed portion is indicated by cross area 16 and the surface of the tip's distal end is indicated by shaded area 17. When using this prior art tool, if the leads prior to bonding are not in alignment when the surface of the tool makes contact with the top lead, there is no mechanism by which to correct the misalignment. The bonding tool simply presses down on the top lead and the bonding takes place.

In some cases, there are over three hundred lead connections to make per package. Therefore, if misalignment occurs and an inadequate connection is made which either results in a weak connection or a short, the loss in manufacturing time and materials is substantial. Misalignment can be caused by shrinkage factors, bent leads and also tolerances in other assembly steps.

SUMMARY OF THE INVENTION

The present invention is a single point bonding tool having a configuration which aligns misaligned leads. The single point bonding tool of the present invention has a surface consisting of parallel concave lines. Therefore, upon contact with a lead, the tool's tip guides the leads into alignment as the tool applies force to the lead.

DETAILED DESCRIPTION OF THE INVENTION

Figure 1:
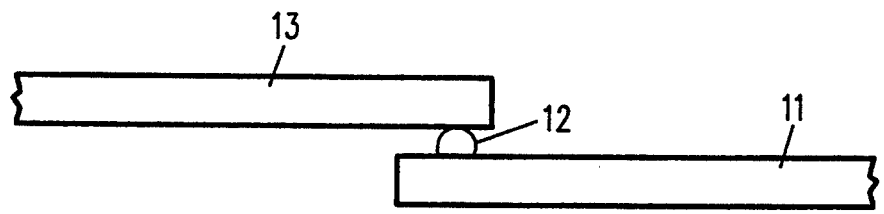
FIG. 1 shows a die pad and a lead, one on top of the other, prior to their connection.
Figure 2:
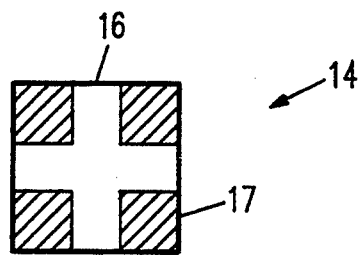
FIG. 2 shows the surface of the tip of a single point bonding tool of the prior art.
Figure 3:
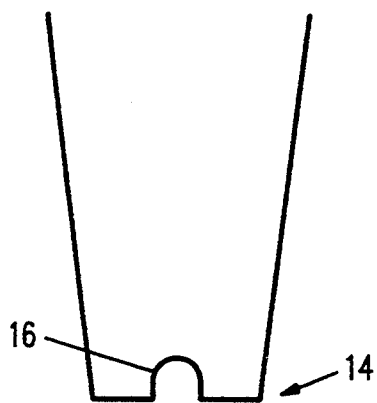
FIG. 3 shows a side view of the tip of a single point bonding tool of the prior art.
Figure 4:
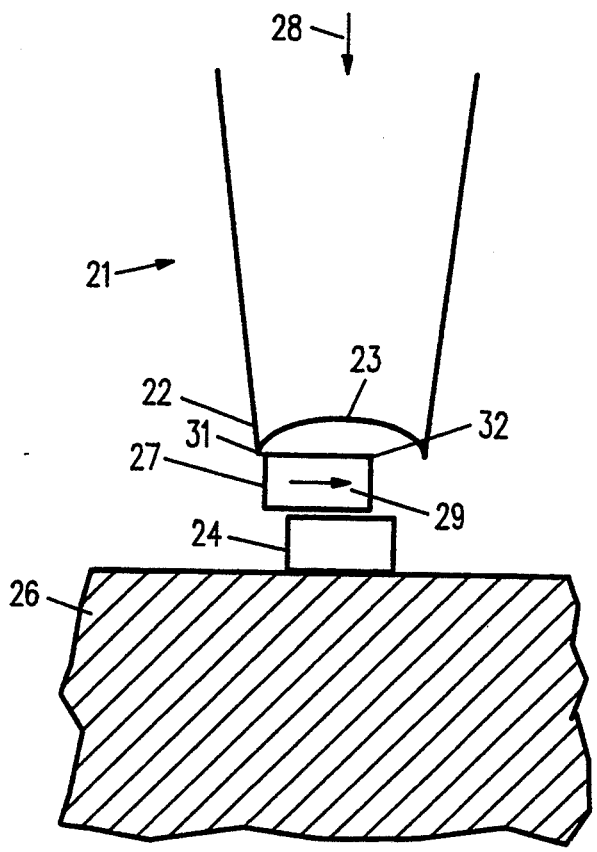
FIG. 4 shows a side view of the tip of a single point bonding tool of the present invention and a cross sectional view of two unaligned leads positioned for bonding.
Figure 5:
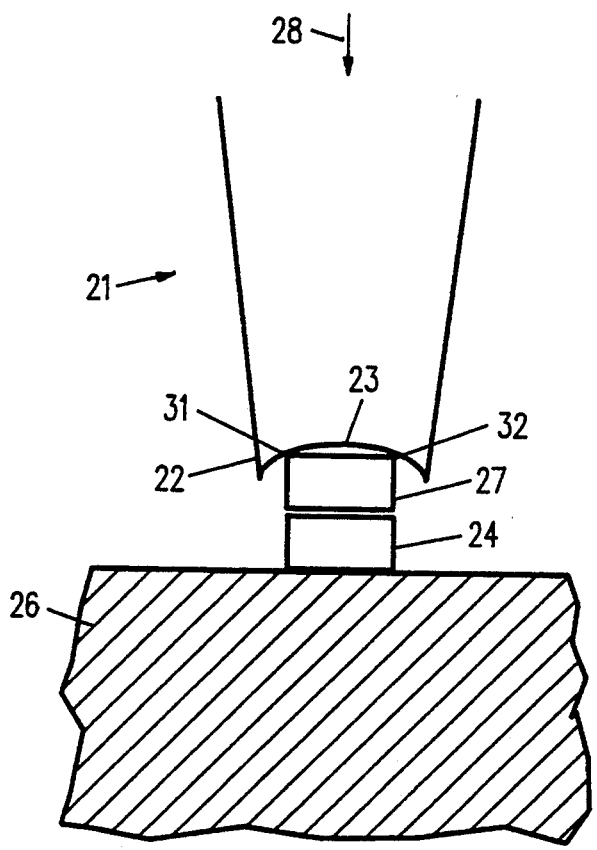
FIG. 5 shows a similar view as that shown in FIG. 4, except that the leads are shown in alignment.

Referring to FIGS. 4 and 5, a single point bonding tool 21 of the present invention is shown. The tool 21 has an elongated portion, ending at tip 22, which is configured to have a concave surface 23 at its distal end. FIGS. 4 and 5 also show the cross section of a pair of leads which are positioned below the tool 21. The bottom lead 24 which could be a die pad, a bond finger on a package, or leads of a lead frame rests on or is attached to a fixed surface 26. The top lead 27 makes contact with the tool surface 23.

FIG. 4 which shows top lead 27 out of alignment with bottom lead 24. When the concave surface 23 of tip 22 comes into contact with top lead 27 and force is subsequently applied to the tool in downward direction indicated by arrow 28, tool 21 guides top lead 27 into alignment with bottom lead 24. The concavity of the tip 22 causes the lead 27 to be moved over the center of lead 24. As the tool is forced in the downward direction 28, the corner 31 of top lead 27 slides along the concave surface 23 in the direction of arrow 29 until the opposite corner 32 also meet surface 23. FIG. 5 shows both corners 31 and 32 in contact with concave surface 23 and the top lead 27 generally in alignment with bottom lead 24. Thus, the present invention brings laterally out of line leads into alignment.

The dimensions of the tool may vary depending upon the application for which its use is intended. Furthermore, not only is the present invention useful for inner-lead bonding and outer-lead bonding, it is also useful in any situation requiring alignment of leads or connectors in the manufacture of integrated circuits or otherwise.

The advantages provided by the present invention include consistent bond strength and thus higher quality goods. Moreover, because there are fewer misaligned leads, less time is spent reworking the connections to form adequate connections and fewer resources and materials are wasted when the rejects are not salvageable. Therefore the present invention provides a higher production yield.

Any other surface than that shown in FIGS. 4 and 5 which will cause the leads to be moved into alignment is also within the scope of the present invention. For example, instead of a completely concave surface as shown, the surface can be, for example angled or faceted. The distal end of the tip defines a distal plane having a surface which has a perimeter. When the surface takes an angled, faceted, or other symmetrically indented configuration, the perimeter of the surface remains in the distal plane. By having a symmetrical indentation encompassing most of the distal end of the tip's surface and only leaving the perimeter of the surface in the distal plane, such as a curved surface does, the tip is configured to provide force in the downward direction onto the first lead and adjustment in the position of the first lead in a lateral direction in order to align the first lead with the second lead.

What is claimed is:

1. A single point bonding tool for connecting leads together, said tool including an end portion comprising, a distal end solely having a faceted surface.

2. A single point bonding tool as recited in claim 1 wherein one of said leads is a die pad and another of said leads is a tape lead.

3. A single point bonding tool as recited in claim 1 wherein one of said leads is a tape lead and another of said leads is a bond finger on a lead frame package.

4. A tool for bonding a first lead to a second lead, said tool including an end portion, said end portion comprising a tip being configured with a concave faceted surface to provide force in the downward direction to said first lead and adjustment in the portion of said first lead in a lateral direction in order to align said first lead with said second lead.

5. A single point bonding tool as recited in claim 4 wherein said first lead is a die pad and said second lead is a tape lead.

6. A single point bonding tool as recited in claim 4 wherein said first lead is a tape lead and said second lead is a bond finger on a package.

7. A device for bonding connectors, said device comprising an end portion having a tip which is contoured to solely have a faceted surface.

8. A device as recited in claim 7 wherein one of said connectors is a die pad and another of said connectors is a tape lead.

9. A device as recited in claim 7 wherein one of said connectors is a tape lead and another of said connectors is a bond finger on a die package or lead frame.

10. A method for bonding a first lead to a second lead, said method comprising the steps of having a solely having a curved surface;
positioning the first lead in the vicinity above the second lead such that the first lead can be laterally offset from the second lead;
contacting the first lead with a bonding tool having a tip solely having a curved surface; and
with said bonding tool, laterally adjusting the lead in a manner which moves the first lead and brings the first lead into lateral alignment with the second lead.

11. A method for connecting a first connector to a second connector; positioning said first connector in the vicinity above said second connector; such that the first lead can be laterally offset from the second lead;
with a single point bonding tool, making contact with said first connector; and
with said single point bonding tool, moving said first connector to a position directly above said second connector.

* * * * *